United States Patent [19]
Cheffings et al.

[11] Patent Number: 5,387,550
[45] Date of Patent: Feb. 7, 1995

[54] METHOD FOR MAKING A FILLET FOR INTEGRATED CIRCUIT METAL PLUG

[75] Inventors: David F. Cheffings; Martin C. Roberts, both of Boise, Id.

[73] Assignee: Micron Technology, Inc., Boise, Id.

[21] Appl. No.: 832,349

[22] Filed: Feb. 7, 1992

[51] Int. Cl.$^6$ ............... H01L 21/44; H01L 21/48
[52] U.S. Cl. ................ 437/189; 437/190; 437/193; 437/195
[58] Field of Search ........... 437/195, 194, 67, 192, 437/186–187, 189–193, 203

[56] References Cited

U.S. PATENT DOCUMENTS

| | | | |
|---|---|---|---|
| 4,833,519 | 5/1989 | Kawano et al. | 437/195 |
| 4,981,550 | 1/1991 | Hottemann | 156/643 |
| 5,026,666 | 6/1991 | Hills et al. | 437/195 |
| 5,099,304 | 3/1992 | Takamura et al. | 437/67 |
| 5,106,781 | 4/1992 | De Vries | 437/194 |
| 5,164,330 | 11/1992 | Davis et al. | 437/228 |
| 5,210,054 | 5/1993 | Ikeda et al. | 437/228 |
| 5,227,337 | 7/1993 | Kadomura | 437/228 |
| 5,231,051 | 7/1993 | Baldi et al. | 437/187 |

FOREIGN PATENT DOCUMENTS

2212979A 8/1989 United Kingdom.
WO8804831 6/1988 WIPO.

OTHER PUBLICATIONS

Wolf; Silicon Processing for the VLSI ERA vol. 2 pp. 244–258 (1990).

Primary Examiner—Olik Chaudhuri
Assistant Examiner—H. Jey Tsai
Attorney, Agent, or Firm—Dorr, Carson, Sloan & Peterson

[57] ABSTRACT

A well in a semiconductor wafer is partially filled by a tungsten plug having an irregular surface. There is an aluminum line exterior of the well for electrically connecting the tungsten plug into an electrical circuit. A doped polysilicon fillet having an irregular surface meshing with the irregular surface of the tungsten plug fills the portion of the well between the plug and line, making a reproducible good electrical connection between the tungsten plug and the aluminum line. The poly fillet is formed by a poly deposit and planarization performed between a tungsten plug overetch and aluminum line deposition.

12 Claims, 1 Drawing Sheet

METHOD FOR MAKING A FILLET FOR INTEGRATED CIRCUIT METAL PLUG

BACKGROUND OF THE INVENTION

1. Field of the Invention

The invention in general relates to the fabrication of integrated circuits and more particularly to an apparatus and method for improving metal coverage at a step in the integrated circuit structure.

2. Statement of the Problem

As is well-known, integrated circuits, sometimes called semiconductor devices, are generally mass produced by fabricating hundreds of identical circuit patterns on a single semiconducting wafer, which wafer is subsequently sawed into hundreds of identical dice or chips. While integrated circuits are commonly referred to as "semiconductor devices" they are in fact fabricated from various materials which are either electrically conductive, electrically non-conductive, or electrically semiconductive. Silicon, the most commonly used semiconductor material, can be used in either the single crystal or polycrystalline form. In the integrated circuit fabrication art, polycrystalline silicon is usually called "polysilicon" or simply "poly", and shall be referred to as such herein. Both forms of silicon may be made conductive by adding impurities to it, which is commonly referred to as "doping". If the doping is with an element such as boron which has one less valence electron than silicon, electron "holes" become the dominant charge carrier and the doped silicon is referred to as P-type silicon. If the doping is with an element such as phosphorus which has one more valence electron than silicon, additional electrons become the dominant charge carriers and the doped silicon is referred to as N-type silicon. Silicon dioxide is also commonly used in integrated circuits as an insulator or dielectric. Its use is so common that in the art is generally referred to as "oxide" without ambiguity.

Integrated circuit fabrication may begin with a lightly-doped P-type silicon substrate, a lightly-doped N-type silicon substrate, or lightly-doped epitaxial silicon (deposited crystalline silicon) on a heavily doped substrate. For the sake of simplicity, the invention will be described using lightly-doped P-type silicon as the starting material, although it may be implemented with other materials as the starting point. If other materials are used as the starting point, there may be differences in materials and structure as is well-known in the art, e.g. with N-type silicon as the starting point dopant types may be reversed, or P-type wells may be introduced.

The advantages of building integrated circuits with smaller individual circuit elements so that more and more circuitry may be packed on a single chip are well-known: electronic equipment becomes less bulky, reliability is improved by reducing the number of solder or plug connections, assembly and packaging costs are minimized, and improved circuit performance, in particular higher clock speeds. However, the smaller the size, the more difficult it is to fabricate and locate individual parts, such as contacts, within the specifications and tolerances required.

Integrated circuit memories are generally the most densely-packed integrated circuits commonly manufactured today. In memories and other structures requiring densely packed contacts, contacts are conventionally fabricated by creating a photolithographic mask containing the pattern of the contacts to be fabricated, coating the wafer with a light-sensitive material called photoresist or resist, exposing the resist-coated wafer to ultraviolet light through the mask to soften or harden parts of the resist depending on whether positive or negative resist is used, removing the softened parts of the resist, etching the wafer to remove the part unprotected by the resist, and stripping the remaining resist. Generally the etching process is designed to form wells which penetrate the semiconductor structure down to the areas to which electrical connection is to be made. An area in a integrated circuit to which electrical connection is to be made is generally called an active area (AA). Current integrated circuit technology often includes a thin layer of diffusion barrier material, such as titanium nitride (TIN) or titanium tungsten (TiW), interposed between the AA and the metal contact which connects the active area to an electrical source. This diffusion barrier layer prevents interdiffusion of the material in the active area, generally silicon, and the contact metal. After the diffusion barrier is laid down, a layer of metal is then deposited on the semiconductor wafer to fill the wells. After the metal layer is laid down, it is then etched back to remove all the metal from the various surfaces of the semiconductor wafer, except the metal in the wells. The metal which fills the well is generally called a "plug". A metal interconnect which may be a bit line or a word line for example, is then deposited which connects the plugs to an appropriate circuit.

In prior generations of integrated circuits, aluminum or doped polysilicon have been used as the plug "metal". As the contacts have become smaller, especially in sub-micron sizes, tungsten has become the metal of choice, the plugs made of tungsten have become known "tungsten plugs" and a specialized field of engineering has developed generally called "tungsten plug technology". Generally, aluminum is used for the metal interconnect line.

In semiconductor devices, such as memories, where the contacts are so densely packed as to require sub-micron contact sizes, the wells have high aspect ratios, that is the wells are relatively deep compared to their width. In such high aspect ratio wells, as the plug metal is laid down, it tends to cover over the hole before the metal layers covering the opposite sides of the wells meets. This forms an open area in the well called a "keyhole". When the plug metal layer etch back is performed, the keyhole is opened, which forms an irregular upper surface on the metal plug in the well. Further, the TiN diffusion barrier material generally etches faster than the tungsten. This creates structures called "barrier fangs" around the outer periphery of the well where the TiN lining the sidewall has been eroded more deeply than the metal plug, further increasing the irregularity of the upper surface of the metal plug. It is very difficult to form a good contact between this irregular upper surface of the tungsten plug and the aluminum interconnect line. Metal applied to such irregular surfaces tends to crack or break over time, which can cause a defective integrated circuit and can create major reliability problems. There is a need for apparatus and methods that will permit good electrical contact between the aluminum interconnect line and the tungsten plugs to be routinely made and prevent defective integrated circuits.

In addition to the above problems, in order to make sure that all plug metal is removed from critical surfaces, it is usually necessary to "overetch" in the tungsten etch process, that is, etch so much that the metal plugs recede in the wells. This overetch makes it even more difficult to make good contact between the metal plugs and metal lines. Thus there is a need for apparatus and methods that can create reliable electrical contact between the metal lines and plugs even when the plugs are recessed and have an irregular upper surface.

One solution to the problems discussed above has been to use a plug of doped polysilicon rather than a plug of metal. However doped polysilicon is not as good a conductor as metals such as tungsten and aluminum, and the use of a doped silicon material adjacent silicon material of dissimilar material can create P-N junction diodes that can alter the electrical properties of the semiconductor device. Thus this "solution" can create larger problems than the problems it solves. There is a need therefore for a plug design that consistently produces good electrical contact between the active areas and metal lines in semiconductor devices and which does not create high resistivity, P-N junction diodes, and other electrical problems.

The wells discussed above appear in cross-section as a double step, i.e. a step down and a step up. The problems discussed above with respect to filling the wells and making electrical contact with the plug in the well are special cases of the problems generally associated with step coverage of aluminum metal over recessed tungsten plugs in semiconductor fabrication. Step coverage has consistently been a problem in semiconductor device fabrication when the covering material is aluminum. Thus there is a need for apparatus and methods which improves step coverage by aluminum over recessed tungsten plugs.

3. Solution to the Problem

The present invention solves the above problems by providing a process in which, prior to formation of the metal line, a thin layer of doped polysilicon is deposited which fills in the recessed well and smooths out the irregular surface of the tungsten plug. Preferably, the deposition of the poly layer is followed by planarizing by either a dry etch or a chemical mechanical polish. This creates a poly fillet which makes good contact with the irregularities, fills the recess, and makes a smooth surface to which it is easy to make electrical contact with long-term reliability.

SUMMARY OF THE INVENTION

The invention provides a semiconductor device comprising: a semiconductor wafer having a well formed in it; a metal plug partially filling the well; conducting means exterior of the well for electrically connecting the metal plug into an electrical circuit; a doped silicon fillet filling a portion of the well between the metal plug and the conducting means. Preferably, the doped silicon fillet comprises doped polysilicon. Preferably the doped polysilicon is insitu doped polysilicon. Preferably, the metal plug is a tungsten plug. Preferably, the conducting means is a metal line. Preferably, the wafer includes a layer of silicon dioxide and the well is formed in the layer of silicon dioxide. Preferably, the semiconductor wafer further comprises an active area and the tungsten plug makes electrical contact with the active area. Preferably, the active area comprises doped silicon, and the semiconductor device further includes a diffusion barrier between the active area silicon and the metal plug.

In another aspect the invention provides a semiconductor device comprising: a semiconductor wafer having a well formed in it; a tungsten plug at least partially filling the well, the tungsten plug having an irregular surface; conducting means, at least partially exterior of the well, for electrically connecting the metal plug into an electrical circuit; a doped polysilicon fillet between the tungsten plug and the conducting means and having an irregular surface meshing with the irregular surface of the tungsten plug.

The invention also provides a method of fabricating a semiconductor device comprising the steps of: providing a semiconductor wafer having a well formed in it and a metal plug partially filling the well; creating a layer of doped silicon on the wafer, thereby filling the well with the doped silicon; planarizing the layer of silicon to provide a poly fillet in the well, the fillet having a smooth contact surface. Preferably, the step of creating a layer of doped silicon comprises creating a layer of doped polysilicon. Preferably, the step of creating comprises creating a layer of insitu doped polysilicon in an LPCVD process. Preferably, the step of planarizing comprises a dry etch step. Alternatively, the step of planarizing comprises a chemical mechanical polishing step.

In another aspect, the invention provides a method of fabricating a semiconductor device comprising the steps of: providing a semiconductor wafer having a well formed in it and a metal plug at least partially filling the well and having an irregular surface; creating a layer of doped silicon filling irregularities in the irregular surface of the metal plug to form a fillet; forming a conductive layer making electrical contact with the fillet. Preferably, the step of providing comprises providing a semiconductor wafer having a diffusion barrier lining the well about the metal plug, and wherein there is an irregular surface at the juncture of the metal plug and the diffusion barrier, and the step of creating a layer of doped silicon comprises creating a layer which fills in irregularities in the irregular surface at the juncture of the metal plug and the diffusion barrier.

The poly fillet is not in contact with the active area and therefore no P-N junction is formed. Thus the invention not only provides a solution to the metal breakage problem in tungsten plug technology, but offers a way to do so without creating additional electrical problems. Numerous other features, objects and advantages of the invention will become apparent from the following description when read in conjunction with the accompanying drawings.

DESCRIPTION OF THE PREFERRED EMBODIMENT

1. Overview

Figure 1:
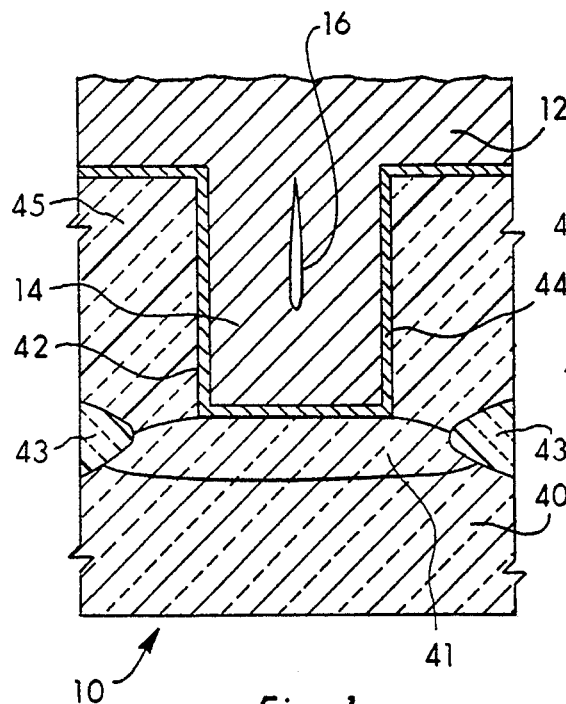
FIG. 1 is a cross-sectional view of a portion of a semiconductor device wafer according to the preferred embodiment of the invention after the tungsten plugs have been created in a metal deposition process.
Figure 2:
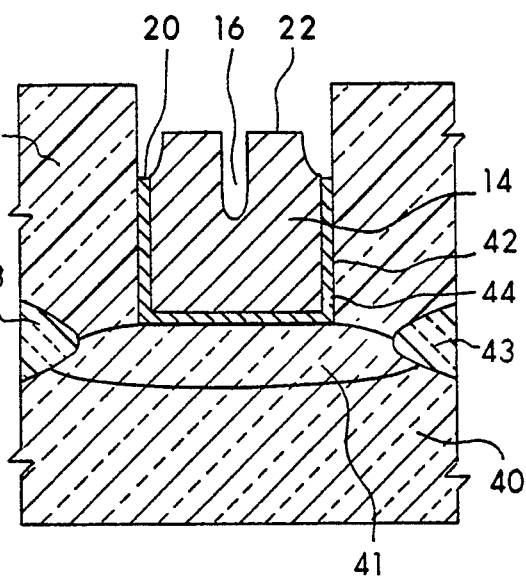
FIG. 2 is a cross-sectional view of the portion of the semiconductor device wafer of FIG. 1 after the blanket tungsten etch back.
Figure 3:
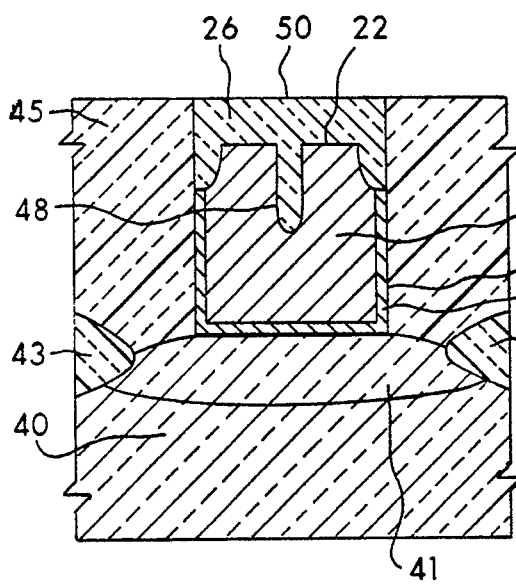
FIG. 3 is a cross-sectional view of the portion of the semiconductor device wafer of FIG. 2 after the poly fillet deposition and planarization.

Turning now to FIG. 1, a cross-sectional view of a portion of a semiconductor wafer 10 according to the invention is shown immediately after the deposition of the metal layer 12. This deposition has created plug 14 having a keyhole 16. In FIG. 2, the metal layer 12 has been etched back in a blanket over etch, which has opened up keyhole 16 and created barrier fangs 20 to create an irregular surface 22 on plug 14. In FIG. 3 a doped poly fillet 26 has been deposited and etched back, and in FIG. 4 the metal line 30 has been deposited. As can best be seen in FIG. 4, the poly fillet 26 provides an easily reproducible good electrical connection between the plug 14 and metal line 30.

2. Detailed Description of the Fabrication

Returning now to FIG. 1, semiconductor wafer 10 includes a layer 40 which is preferably lightly doped P-type single crystal silicon, but may also be polysilicon, N-type silicon, or any other type of conducting or semiconducting material that may be used in a semiconductor device. An area 41 of N-type doping within the layer 40 creates an active area (AA) 41 to which it is desired to make electrical connection. On either side of the active area 41 are field oxide regions, such as 43. A silicon oxide layer 45 has been deposited over the active area 41 and field oxide 43, and a well 42 has been formed in the oxide 45, extending down through the oxide 45 to the active area 41. In this specification the term well means a cavity of any sort. Although in the preferred embodiments described the sides of the well are of equal height, this is not necessary. For example the well could also be a generally V-shaped cavity formed by the vertical and horizontal sides of a step. As can be seen from FIG. 1, the well of the preferred embodiment may be considered to be two steps, a step down and a step up. It should also be understood that the structure of the semiconductor wafer 10 in the region of well 42 is exemplary; that is, a relatively simple application of the invention is shown in order that the inventive aspects will be easier to grasp. In many applications the structure of the semiconductor wafer 10 in the region of the well 42 will be more complex, involving, for example, multiple layers of doped polysilicon and other materials.

Continuing with the discussion of FIG. 1, a thin diffusion barrier 44 has been deposited lining the well 42. The diffusion barrier 44 is preferably titanium nitride (TIN,) but also may be titanium tungsten (TiW) or any other material used as a diffusion barrier in semiconductor devices. Plug 14 has been formed in well 42 by depositing a metal layer 12, which in the preferred embodiment is tungsten, but may also be any other suitable metal. The fabrication up to this point is conventional, and conventionally creates a keyhole 16 due to the fact that the well gets layered over before the depositions building up on the vertical surfaces of the well 42 in FIG. 1 can meet.

Drawing attention to FIG. 2, a blanket etch back has been performed to remove the layer 12 above the plug 14. Since metal such as tungsten can cause serious shorting problems if any is left on wafer surfaces it is not supposed to be on, generally a small amount of over etch is preferred in this step rather than risk under etch. Such an over etch can recess plug 14 up to 15% of the depth of well 42, as shown in FIG. 2, which opens up keyhole 16. Further, the TiN of barrier 44 tends to etch more than plug metal 14, creating a barrier fang 20 around the periphery of plug 14.

In FIG. 3 a layer of polysilicon has been deposited and planarized to create poly fillet 26. In the preferred embodiment, fillet 26 is composed of insitu N-doped polysilicon, although any type of silicon used in semiconductor devices could be used. The fillet 26 is preferably deposited in a LPCVD (Low Pressure Chemical Vapor Deposition) process, doping with phosphorous by using a phosphine gas. This keeps the processing temperature to a minimum, keeping junction depths shallow, which is important as tranistors become smaller. The polysilicon deposition tends to fill small crevices and other irregularities much more completely and smoothly than a conventional metal deposition can. Thus the lower surface 48 of polysilicon fillet 26 meshes with the upper surface 22 of metal plug 14 resulting in an excellent, relatively easily reproducible electrical connection to plug 14 without the problems of cracking and breakage of the prior art. After the doped poly silicon has been deposited, it is planarized, preferably by a dry etch step or a chemical mechanical polish (CMP). Any other suitable planarization method may be used. The result is a smooth, planar surface 50 to which electrical contact is relatively easily made.

Figure 4:
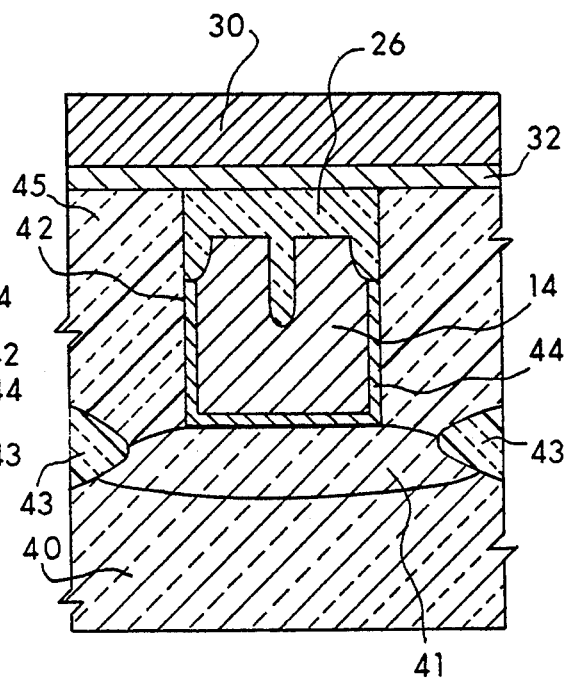
FIG. 4 is a cross-sectional view of the portion of the semiconductor device of FIG. 3 after the metal line has been deposited.

In FIG. 4 the metal line 30 has been deposited, preferably, in a two step process of sputtering a thin layer 32 of titanium followed by sputtering of a thicker layer 34 of aluminum/copper. However any suitable metal, such as aluminum/silicon/copper, and any suitable deposition process may be used. Metal line 30 provides the connection of plug 14 and active area 41 into the desired electrical circuit.

The poly fillet 26 may generally range from about 0.1 $\mu$m thick (the vertical direction in the figures) to about 0.4 $\mu$m thick, and nominally is about 0.2 $\mu$m thick. It may range from about 0.7 $\mu$m wide (the horizontal direction in the figures) to about 0.9 $\mu$m wide, and nominally is about 0.8 $\mu$m wide. The dimensions of the other parts of the invention are known by those skilled in the art.

A feature of the invention is that the poly fillet 26 according to the invention solves the reliability problems that have been plaguing tungsten plug technology, without adding further electrical problems. The size of the fillet 26 is small enough that it does not add significantly to the total resistance of the circuit. Further, it does not contact active area 41 so a junction diode is not created.

Another feature of the invention is that it solves the potentially major reliability problems associated with tungsten plug technology without adding any mask steps which can be expensive. The fillet is also self-aligning, and therefore it does not require any close-tolerance alignment operations which can be relatively expensive. Further, materials and processes that are standard in the semiconductor device art are used, thus it does not require any additional tooling or equipment to the conventional fabrication process.

There has been described a novel poly fillet which solves metal connector breakage problems in tungsten plug technology and which has many other advantages. It should be understood that the particular embodiment shown in the drawings and described within this specification is for purposes of example and should not be construed to limit the invention which will be described in the claims below. Further, it is evident that those skilled in the art may now make numerous uses and modifications of the specific embodiment described, without departing from the inventive concepts. For example, now that it is seen to be possible to solve the connector breakage problem in the tungsten plug technology by use of a poly fillet 26, the poly fillet solution can be used in other situations where there is a problem due to metal breakage or poor contact over a cavity or step. Or the various parts described may be made with a wide variety of dimensions and materials. A greater or lesser number of parts may be used. Consequently, the invention is to be construed as embracing each and every novel feature and novel combination of features present in and/or possessed by the semiconductor device described.

What is claimed is:

1. A method of fabricating a semiconductor device comprising the steps of:
    providing a semiconductor wafer having an upper surface;
    forming a well having a depth in said upper surface;
    completely filling said well and covering said upper surface with a blanket metal deposition;
    overetching said blanket metal to completely remove said blanket metal from said upper surface and from an upper portion of said well to provide a metal plug partially filling said well, said upper portion being up to fifteen percent of the depth of said well;
    completely filling said upper portion of said well with doped silicon to provide a smooth electrical contact surface that is planar with said upper surface.

2. A method as in claim 1 wherein said step of filling said upper portion of said well comprises creating a layer of doped polysilicon.

3. A method as in claim 2 wherein said step of filling said upper portion of said well comprises creating a layer of in situ doped polysilicon.

4. A method as in claim 3 wherein said step of filling said upper portion of said well comprises an LPCVD process.

5. A method as in claim 1 further comprising a step of planarizing said doped silicon using a dry etch process.

6. A method as in claim 1 further comprising a step of planarizing said doped silicon using a chemical mechanical polishing process.

7. A method as in claim 1 wherein said metal plug has an irregular upper surface and said step of filling said upper portion of said well with doped silicon comprises creating a polysilicon layer which fills in irregularities on said irregular upper surface of said metal plug.

8. A method as in claim 1 further comprising a step of providing a diffusion barrier before said step of overetching, said diffusion barrier lining said well about said metal plug, wherein after said step of overetching there is an irregular surface at the juncture of said metal plug and said diffusion barrier, and wherein said step of filling said upper portion of said well with doped silicon comprises creating a polysilicon layer which fills in irregularities in said irregular surface at the juncture of said metal plug and said diffusion barrier.

9. A method of fabricating a semiconductor device comprising the steps of:
    providing a semiconductor wafer having an upper surface;
    forming a well having a depth in said upper surface;
    depositing a blanket of metal to overfill said well and cover said upper surface, said blanket of metal being more conductive than polysilicon;
    etching said blanket of metal to expose said upper surface and provide a metal plug only partially filling said well, wherein said metal plug includes an irregular upper surface;
    creating a layer of doped silicon having a lower surface filling irregularities in said irregular surface of said metal plug and having a smooth upper surface planar with said upper surface of said semiconductor wafer, said layer of doped silicon forming a fillet;
    forming a conductive layer making electrical contact with said upper surface of said fillet.

10. A method as in claim 9 further comprising steps of: providing a diffusion barrier before said step of etching, said diffusion barrier lining said well about said metal plug, wherein after said step of etching there is an irregular surface at the juncture of said metal plug and said diffusion barrier; and
    said step of creating a layer of doped silicon comprises creating a fillet which fills in irregularities in said irregular surface at the juncture of said metal plug and said diffusion barrier.

11. A method of fabricating a semiconductor device comprising the steps of:
    providing a semiconductor wafer having an upper surface;
    forming a well in said upper surface;
    lining said well with a titanium nitride (TiN) diffusion barrier;
    depositing a blanket metal layer over said diffusion barrier, wherein the step of depositing fills said well and covers said upper surface with said blanket metal layer;
    etching said blanket metal layer to completely remove said blanket metal layer from said upper surface and from an upper portion of said well to provide a metal plug partially filling said well, wherein the etching step provides a first irregularity on an upper portion of said metal plug and a second irregularity at a junction of said TiN diffusion barrier with said metal plug;
    filling said first and second irregularities with doped polysilicon using a low pressure chemical vapor deposition process to provide a smooth electrical contact surface; and
    planarizing said doped polysilicon.

12. A method of fabricating a semiconductor devise comprising the steps of:
    providing a semiconductor wafer having an upper surface;
    forming a well having a high aspect ratio in said upper surface;
    lining said well and said upper surface with a titanium nitride (TiN) diffusion barrier;
    depositing a blanket metal layer having a greater conductivity than polysilicon over said diffusion barrier, wherein the step of depositing fills said well, covers said upper surface with said blanket metal layer, and forms an internal keyhole in said blanket metal layer;
    overetching so as to remove all of said blanket metal layer and said diffusion barrier from said upper surface and from an upper portion of said well to provide a metal plug partially filling said well, said upper portion being up to fifteen percent of the depth of said well wherein the overetching step exposes a keyhole irregularity on an upper portion of said metal plug and a barrier fang irregularity at a junction of said TiN diffusion barrier with said metal plug; and filling said keyhole and barrier fang irregularities and said upper portion of said well with doped silicon to provide a smooth electrical contact surface that is planar with said upper surface of said semiconductor substrate.

* * * * *